United States Patent [19]

Eidal

[11] Patent Number: 4,643,936
[45] Date of Patent: Feb. 17, 1987

[54] BACKUP MATERIAL FOR SMALL BORE DRILLING

[75] Inventor: Russell C. Eidal, Chippewa Falls, Wis.

[73] Assignee: Control Data Corporation, Minneapolis, Minn.

[21] Appl. No.: 829,638

[22] Filed: Feb. 14, 1986

[51] Int. Cl.[4] ............... B32B 15/08; B32B 15/10; B32B 27/10
[52] U.S. Cl. .................... 428/214; 428/215; 428/412; 428/421; 428/458; 428/461; 428/464; 428/901
[58] Field of Search ........... 428/464, 458, 901, 215, 428/214, 54, 461, 412, 421

[56] References Cited

U.S. PATENT DOCUMENTS

| 4,343,846 | 8/1982 | Kohn | 428/464 |
| 4,408,365 | 10/1983 | Palmer | 428/54 X |
| 4,456,657 | 6/1984 | Cassat et al. | 428/458 |
| 4,562,119 | 12/1985 | Darms et al. | 428/458 |

Primary Examiner—Thomas J. Herbert
Attorney, Agent, or Firm—J. A. Genovese; R. M. Angus

[57] ABSTRACT

A backup material for small bore drilling in hard crystalline materials, such as multilayer circuit boards containing polyimide/glass, polyimide kevlar or modified epoxy BT/glass, includes at least one layer of hard crystalline material. Standard LCOA material with an additional layer selected from the group comprising polyimides, fluorocarbons and high temperature polycarbonates has proven successful.

4 Claims, 2 Drawing Figures

Fig. 1
Prior Art
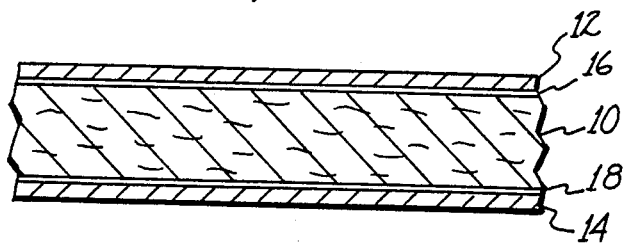
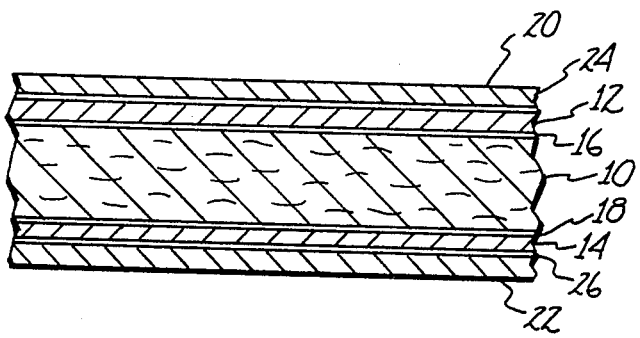
Fig. 2

BACKUP MATERIAL FOR SMALL BORE DRILLING

This invention relates to a backup or substrate for drilling small holes in polyimide and modified epoxy materials.

Multilayer printed circuit boards are typically constructed of an insulative layer separating conductive layers, such as copper. Standard multilayer boards, having 2 to 20 layers, range in thickness from 0.015 to about 0.125 inches each. Heretofore, it was possible to successfully drill holes down to about 0.006 inches in diameter in printed circuit boards constructed of epoxy glass using backup materials such as LCOA, a material commercially available from Laminating Company of America of Escondido, Calif. However, more recently printed circuit boards have been constructed of polyimide/glass, polyimide/kevlar and modified epoxy BT/glass materials. These particular materials are hard crystalline structures, such that drilling in them is more difficult than in prior materials. It has not been possible to drill holes at the small diameters previously achieved using existing backup materials, such as the LCOA material. Particularly, it has been found that attempts to drill apertures smaller than about 0.0165 inches in hard crystalline structures, having thicknesses greater than about 0.065 inches, results in a high incidence of drill bit breakage. Further, it has been found impractical to attempt to drill holes in such materials below about 0.0135 inches in diameter. In particular, drill bit breakage occurs largely due to compaction of the hard crystalline material in the flutes of the bit, which material "binds" against the wall of the aperture during bit retraction, causing bit breakage.

I have found, however, that if the backup material also includes a hard crystalline material, the incidence of drill bit breakage is significantly reduced. Without being bound to any theory, it is theorized that when drilling small bores in hard crystalline boards (polyimide and modified epoxy BT glass), the hard crystals (polyimide and epoxy crystals) pack in the flutes of the drill bit. As the drill bit is retracted, the crystals impacted in the flutes bind against the side walls of the bore, and the stress of retraction breaks the drill bit. However, when using a backup material containing a hard crystalline material, such as polyimide, the flutes are cleaned prior to retraction. When the drill bit enters the polyimide and acrylic of the back-up material, the polyimide remains in a one piece sliver, which can withstand extremely high temperatures and thus remain a "slippery" lubricant to the flutes. The sliver of polyimide from the backup material thus forces the crystalline debris out of the flute prior to retraction of the bit.

It is an object of the present to provide a backup material for drilling small holes in hard crystalline structures.

Another object of the present invention is the provision of a hard crystalline, or polyimide, layer on conventional backup materials which have the effect of cleaning the flute of drill bits prior to retraction of the bit.

The above and other features of this invention will fully understood from the following detailed description and the accompanying drawings, in which:

BRIEF DESCRIPTION OF THE DRAWINGS

FIG. 1 is a section view of a backup material in accordance with the prior art; and FIG. 2 is a section view of a backup material for drilling small board holes in hard crystalline structures in accordance with the presently preferred embodiment of the present invention.

Referring to FIG. 1, there is illustrated a section view of a backup material for small bore drilling in accordance with prior art techniques. The particular material illustrated in FIG. 1 is known as LCOA backup material and consists of a layer 10 of compressed wood chips or sawdust in a bonding agent with aluminum foil layers 12 and 14 adhered to both sides thereof by an adhesive layers 16 and 18. As shown in FIG. 2, the present invention, in its preferred form, consists of the standard LCOA material illustrated in FIG. 1 with the addition of layers 20 and 22, consisting of 0.002-inch thick layer of polyimide, commercially available from DuPont as Kapton or Kapton H. The polyimide layers 20 and 22 are adhered to aluminum layers 12 and 14 by a 0.001-inch thick layer of acrylic adhesive, commercially available from Oake or Fortin companies. Conveniently, the polyimide layers may be applied to the aluminum with the acrylic adhesive in a heated lamination (rolling) process.

Tests of the present invention have been conducted. In a first test, standard LCOA backup material was used with a circuit board having ten layers of polyimide and a thickness of 0.70 inches. In this first test, 600 bores were drilled using drill bits having a diameter of 0.0135 inches at a spindle speed of 80,000 RPM. With a drill feed of 40 inches per minute, an average of one broken bit occurred in each 650 bores. In a second test, the same conditions as the first test were used, except the drill bit feed rate was increased to 60 inches per minute. Nearly constant bit breakage occurred in the second test. In similar tests using smaller drill bits of the order of 0.012 inches, 0.011 inches, and 0.010 inches at spindle speeds of 80,000 RPMs and drill feed of 50 inches per minute, broken bits occurred in approximately each 20 bores.

In another set of tests employing backup material in accordance with the presently preferred embodiment of the present invention with polyimide adhered to the LCOA material with an acrylic adhesive, at drill feeds ranging between 30 and 100 inches per minute, and spindle speeds of 80,000 RPM, drilling the same type of boards as in the first test, no broken bits occurred in 1,500 bores using 0.0135-inch diameter bits, no broken bits occurred in 1,500 bores with a drill size of 0.011-inch, and no broken bits occurred in 1,000 bores using drill sizes of 0.010 inches.

Testing on printed circuit boards containing copper layers resulted in no broken bits in over 50,000 bores. Micro sectioning of multilayer circuit boards drilled with backup material in accordance with the present invention showed no degradation in hole quality.

The present invention thus provides an effective material for backup of small bore drilling in hard crystaline structures. Particularly, the material has proven useful in connection with drilling materials constructed of polyimide glass, polyimide-kevlar and modified epoxy BT-glass materials. In addition, although polyimide material is disclosed as being the preferred material to adhered by acrylics to LCOA back-up material, it has also been found that flurocarbons, such as Teflon, and high temperature polycarbonates are also useful in place of polyimide materials.

This invention is not to be limited by the embodiment shown in the drawing and described in the description, which is given by way of example and not of limitation, but only in accordance with the scope of the appended claims.

What is claimed is:

1. In a backup sheet for backing a work sheet during a small bore drilling process, said work sheet containing at least one layer of hard crystalline material selected from the group comprising polyimide/glass, polyimide/kevlar and modified epoxy BT/glass, said backup sheet having a core, the improvement comprising an additional layer of hard crystalline material selected from the group comprising polyimides, fluorocarbons and high temperature polycarbonates fixed to opposite sides of said core.

2. A backup sheet according to claim 1 wherein said additional layer consists of a layer of polyimide of the order of about 0.002 inches thick fixed to said core with a layer of acrylic adhesive of the order of 0.001 inches thick.

3. A backup sheet for backing a work sheet during a small bore drilling process, said work sheet containing at least one layer of hard crystalline material, said backup sheet comprising a core constructed of a compressed organic material and a binder, said organic material being selected from the group comprising wood chips and sawdust, said core having opposite planar surfaces; a first aluminum layer adhered to one of said planar surfaces of said core and a second aluminum layer adhered to the other of said planar surfaces of said core; and a first layer of hard crystalline material adhered to said first aluminum layer and a second layer of hard crystalline material adhered to said second aluminum layer, said first and second layers of hard crystalline material being selected from the group comprising polyimides, fluorocarbons and high temperature polycarbonates.

4. A backup sheet according to claim 3 wherein said first and second layers of hard crystalline materials each consist of a layer of polyimide of the order of about 0.002 inches thick and are adhered to the respective first and second aluminum layers with a layer of acrylic adhesive of the order of about 0.001 inches thick.

* * * * *